United States Patent [19]
Hirose

[11] Patent Number: 5,341,006
[45] Date of Patent: Aug. 23, 1994

[54] SEMICONDUCTOR DEVICE HAVING DIFFUSION-PREVENTING LAYER BETWEEN III-V LAYER AND IV LAYER

[75] Inventor: Tatsuya Hirose, Kawasaki, Japan

[73] Assignee: Fujitsu Limited, Kawasaki, Japan

[21] Appl. No.: 992,042

[22] Filed: Dec. 17, 1992

[30] Foreign Application Priority Data

Dec. 26, 1991 [JP] Japan .............................. 3-344555

[51] Int. Cl.⁵ ............................................ H01L 21/20
[52] U.S. Cl. ................................... 257/190; 257/200; 257/616
[58] Field of Search ............... 257/200, 616, 190, 192, 257/194

[56] References Cited
U.S. PATENT DOCUMENTS

5,091,333 2/1992 Fan et al. ............................. 257/200
5,168,330 12/1992 Vitkavage et al. .................. 257/616

*Primary Examiner*—Robert Limanek
*Attorney, Agent, or Firm*—Armstrong, Westerman, Hattori, McLeland & Naughton

[57] ABSTRACT

A semiconductor device which comprises: a triple-layered structure consisting of a first single-crystalline layer of a group-III—V compound semiconductor, a second single-crystalline layer of a group-IV element semiconductor, and a third single-crystalline layer of an element semiconductor interposed between the first and second layers in a manner such that coherent bond between crystal lattices is established at both interfaces between the first and third layers and between the third and second layers, the third layer preventing component elements of the first and second layers from mutually diffusing from one to the other of the first and second layers. A process according to the present invention ensures a coherent bond between crystal lattices by using an epitaxial growth.

3 Claims, 9 Drawing Sheets

GROWTH TEMP.: 150°C × 5min
Si THICKNESS: 1 ATOMIC LAYER

GROWTH TEMP.: 150°C × 3min
Si LAYER: NONE

Fig. 6B

GROWTH TEMP. : 280°C × 3min
Si LAYER : NONE

Fig. 6C

GROWTH TEMP.: 350°C × 3min
Si LAYER: NONE

SEMICONDUCTOR DEVICE HAVING DIFFUSION-PREVENTING LAYER BETWEEN III-V LAYER AND IV LAYER

BACKGROUND OF THE INVENTION

1. Field of the Invention

The present invention relates to a semiconductor device having a structure in which a first layer of a group-III–V compound semiconductor and a second layer of a group-IV element semiconductor are laminated, and to a process of producing such a semiconductor device.

The herein-used term "group-III–V compound" means a compound of elements from the groups III and V of the periodic table and "group-IV element" means an element from the group IV of the periodic table.

2. Description of the Related Art

Figure 1:
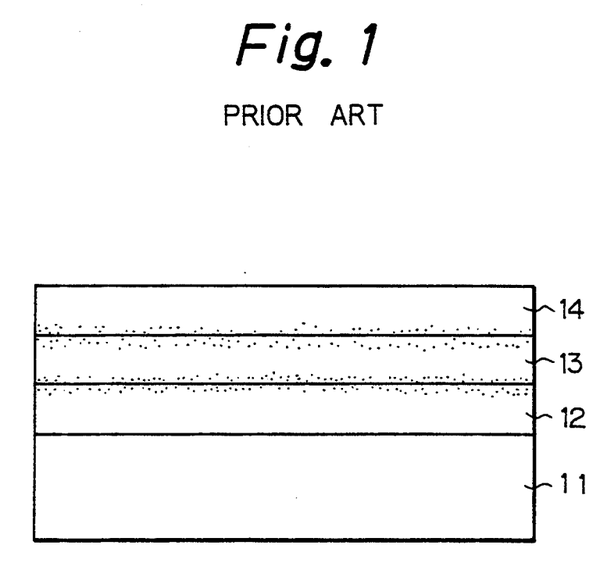
FIG. 1 shows a conventional III-V/IV/III-V laminated structure not having a mutual diffusion-preventing layer, in a sectional view.

It is known that semiconductor devices such as high speed switching devices are produced by using crystal growing processes such as Molecular Beam Epitaxy (MBE), Metalorganic Chemical Vapor Deposition (MOCVD) and Metalorganic Vapor Phase Epitaxy (MOVPE), in which a semiconductor layer having a desired energy gap is grown from a gas phase source epitaxially on a semiconductor substrate heated at a temperature favorable for the growth, i.e., about 600° to 700° C. for example FIG. 1 shows a semiconductor wafer having a typical lamination structure obtained by such a process and composed of a semi-insulating substrate 11 of GaAs, a buffer layer 12 of non-dope GaAs, a carrier-transporting channel layer 13 of non-dope Ge, and an active layer 14 of p-GaAs, the latter three layers having been grown in that order on the substrate 11.

To produce a semiconductor device such as a high speed switching device, the wafer of FIG. 1 is treated by fine processing, during which the shown structure is exposed to high temperatures of about 600° to 700° C. for example.

However, there is a problem in that, during the growth and fine processing steps, component elements of the layers 12, 13 and 14, when having a large diffusion coefficient in the neighboring layers, mutually diffuse from one to the other of the neighboring layers to form an extensive mutual diffusion zone on or near the interface between the neighboring layers, as depicted by the numerous dots in FIG. 1. The resulting extensive mutual diffusion zone, particularly when formed in the carrier-transporting layer 13, degrades the purity of the crystal of the layer 13 and the electric property of the product semiconductor devices such as a high speed switching device.

Japanese Unexamined Patent Publication (Kokai) No. 2-271670 proposed a Ge-GaAs heterojunction having a mutual diffusion-preventing layer referred to as a "transitional layer" or an "intermediate compound semiconductor layer" interposed between the GaAs and Ge semiconductor layers; the "transitional" and "intermediate" layers contain a metal and an element, respectively, having a greater force of bonding with Ga, As and Ge than the bonding forces between Ge and Ga and between Ge and As; and the disclosed advantageous substances are Al and Al-intermetallic compounds for the "transitional" layer and AlAs and GaAlAs for the "intermediate" layer. JPP'677 also disclosed a process of forming such a heterojunction, in which the Ge layer, the "transitional" or "intermediate" layer, and GaAs layer are formed in that order or vice versa without exposure to air.

JPP'670, however, does not consider the lattice coherency of the interposed layer with the neighboring compound (GaAs) or element (Ge) semiconductor layers. For example, the Example portion states that a lower semiconductor layer is an "epitaxial" layer, but does not refer to the epitaxy of the interposed layer and the upper semiconductor layer with respect to the underlying layers. A good electrical property cannot be obtained when a device has a structure in which the lattice coherency of the interposed layer with both the upper and lower semiconductor layers is not established.

JPP'670 also does not consider the actual feasibility of a process of forming the interposed layer. For example, although JPP'670 in the Example proposed Al as an advantageous substance of the interposed, mutual diffusion-preventing layer, the present inventors have found that Al usually forms discrete clusters on a substrate and cannot form a continuous layer with a thickness as small as several atomic layers.

JPP'670 also fails to consider whether the proposed interposed layer can truly prevent the mutual diffusion. The disclosed Example uses an interposed layer which contains a component element of the neighboring semiconductor layer, for example, an interposed layer of GaAlAs contains Ga and As, which are the component elements of the neighboring GaAs semiconductor layer. No reasonable grounds are stated as to why the Ga and As of the interposed layer do not diffuse into the Ge semiconductor layer to form a substantial mutual diffusion zone therein.

SUMMARY OF THE INVENTION

The object of the present invention is to provide a semiconductor device having a laminated structure of a group-III–V compound and group-IV element semiconductor layers and a process of producing the same, in which component elements of the neighboring semiconductor layers are prevented from mutually diffusing from one to the other thereof.

To achieve the object according to the present invention, there is provided a semiconductor device which comprises:

a triple-layered structure consisting of a first single-crystalline layer of a group-III–V compound semiconductor, a second single-crystalline layer of a group-IV element semiconductor, and a third single-crystalline layer of an element semiconductor interposed between the first and second layers in a manner such that coherent bond between crystal lattices is established at both interfaces between the first and third layers and between the third and second layers, the third layer preventing component elements of the first and second layers from mutually diffusing from one to the other of the first and second layers.

According to the present invention, there is also provided a process of producing a semiconductor device, which comprises the steps of:

epitaxially growing, on a single-crystalline substrate, one of two layers of a first single-crystalline layer of a group-III–V compound semiconductor and a second single-crystalline layer of a group-IV element semiconductor;

epitaxially growing, on said one layer, a third single-crystalline layer of an element semiconductor which, when interposed between the first and second layers, prevents component elements of the first and second layers from mutually diffusing from one to the other of the first and second layers; and epitaxially growing the other of said two layers on the third layer, thereby completing a triple-layered structure consisting of the first, second and third single-crystalline layers and in which a coherent bond between crystal lattices is established at both interfaces between the first and third layers and between the third and second layers.

DESCRIPTION OF THE PREFERRED EMBODIMENTS

According to the present invention, a III-V/IV laminate structure is provided with a mutual diffusion-preventing layer interposed between a group-III-V compound semiconductor layer and a group-IV element semiconductor layer and having lattice coherency with respect to both of these semiconductor layers to completely ensure a good electrical property of a semiconductor device by avoiding the possible degradation of the electrical property of a semiconductor device due to a lack of lattice coherency while preventing mutual diffusion of component elements of the semiconductor layers from one to the other of these layers, which would otherwise occur during the crystal growth process and the fine processing of the semiconductor layers because of the heat used therein.

The third, mutual diffusion-preventing layer interposed between the first and second layers preferably has a thickness of from 0.5 to 2 atomic layers.

Preferably, the first layer is composed of one compound semiconductor selected from the group consisting of GaAs-, GaSb-, InAs-, and AlAs-semiconductors, the second layer is composed of Ge-semiconductor, and the third, mutual diffusion-preventing layer is composed of Si-semiconductor.

The interposed Si layer not only prevents the elements of the group-III-V compound semiconductor layer and the element of the group-IV element semiconductor layer from mutually diffusing from one to the other of these semiconductor layers, but also has an advantage in that Si neither diffuses into these adjoining semiconductor layers nor degrades the electrical property thereof, since Si has a coefficient of diffusion in these semiconductor layers as small as the coefficient of self-diffusion of the elements of the semiconductor layers.

Figure 2:
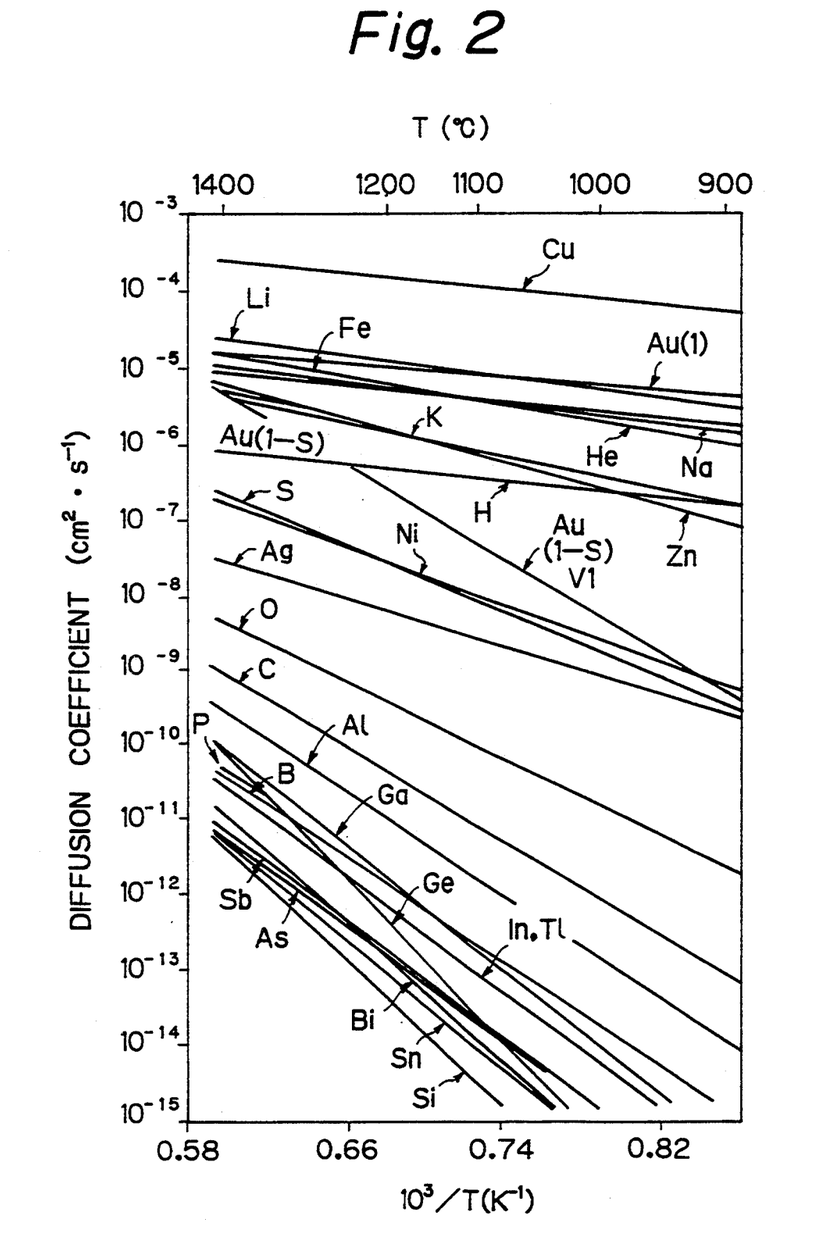
FIG. 2 is a graph showing the diffusion coefficients of elements in silicon as a function of temperature.

FIG. 2 shows the diffusion coefficients of various elements in Si as a function of the temperature at which the diffusion occurs. (See S. M. Sze, "Physics of Semiconductor Devices", 2nd Edition, page 68. FIG. 4)

It can be seen from FIG. 2 that, for example, Ga and As have diffusion coefficients in Si as small as that of the self-diffusion coefficient of Si, and specifically, less than $10^{16}$ cm$^2$-s$^{-1}$ at temperature of from 600° to 700° C. to which a semiconductor device may be exposed during the production process thereof, so that the interposed Si layer prevents the diffusion of Ga and As.

EXAMPLE

Figure 3:
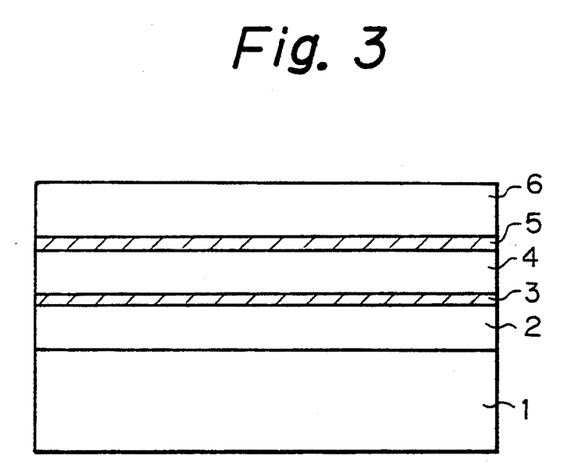
FIG. 3 shows a III-V/IV/III-V laminated structure provided with a mutual diffusion-preventing layer according to the present invention, in a sectional view.

FIG. 3 shows a laminate structure of a semiconductor device according to the present invention, which has a semi-insulating GaAs substrate 1, a non-dope GaAs buffer layer 2, mutual diffusion-preventing Si layers 3 and 5, a non-dope Ge carrier-transporting channel layer 4, and a p-GaAs layer 6.

The laminate structure of FIG. 3 can be advantageously used in a high electron mobility transistor (HEMT) and is typically produced by the sequence of the following process.

Step 1

A 5000Å thick, single-crystalline non-dope GaAs buffer layer 2 is grown on a semi-insulating GaAs substrate 1 by a MBE process under a high vacuum of $10^{-10}$ Torr.

Step 2

A 0.5 to 2 atomic layers thick, single-crystalline Si mutual diffusion-preventing layer 3 is epitaxially grown on the non-dope GaAs buffer layer 2 by a MBE process.

The substrate temperature used for growing the Si layer 3 has a wide enough allowable range that any temperature may be used so long as it enables a single-crystalline Si layer to epitaxially grow, and includes a temperature range of 580° to 600° C. generally used for growing a GaAs crystal.

The term "0.5 atomic layer" means a sparse deposit of Si atoms on a substrate such that the deposited Si atoms do not form a complete monoatomic layer. The interposed Si layer effectively provides the mutual diffusion-preventing effect even when present as such a sparse deposit.

Si and GaAs crystals have lattice constants of 5.431Å and 5.6533Å, which are very close to each other and do not cause substantial distortion of these crystals.

Step 3

A 200Å thick, single-crystalline non-dope Ge carrier-transporting channel layer 4 is grown on the Si layer 3 by a MBE process at a substrate temperature of from 150° to 500° C.

Step 4

A 0.5 to 2 atomic layers thick, single-crystalline Si mutual diffusion-preventing layer 5 is epitaxially grown on the Ge layer 4 by using the same process parameters as used in step 2.

Step 5

A 400Å thick, single-crystalline p-GaAs layer 6 is grown on the Si layer 5 by a MBE process at a substrate temperature of 580° C.

In the thus-obtained laminate structure, Si has a coefficient of diffusion in GaAs as small as $5 \times 10^{-16}$ cm$^2$-s$^{-1}$ at 600° C., which is not substantially different from that of the self-diffusion coefficients of Ga and As in GaAs, and therefore, there is no substantial diffusion of Si atoms from the Si layers 3 and 5 to the GaAs layers 2 and 6, respectively.

Si also has a coefficient of diffusion in Ge as small as $10^{-16}$ cm$^2$-s$^{-1}$ at 600° C., and therefore, there is no substantial diffusion of Si atoms from the layers 3 and 5 to the Ge layer 4.

The interposed Si layer thus prevents mutual diffusion of the component elements of the Ge layer 4 and the GaAs layers 2 and 6 and ensures good crystal and electrical properties at the interfaces of these semiconductor layers.

The small thickness of 0.5 to 2 atomic layers of the Si layers 3 and 5 is also advantageous for providing this effect.

The III–V/IV laminate structure may be either single or duplicated as shown in FIG. 3, to provide this effect according to the present invention.

Figure 4:
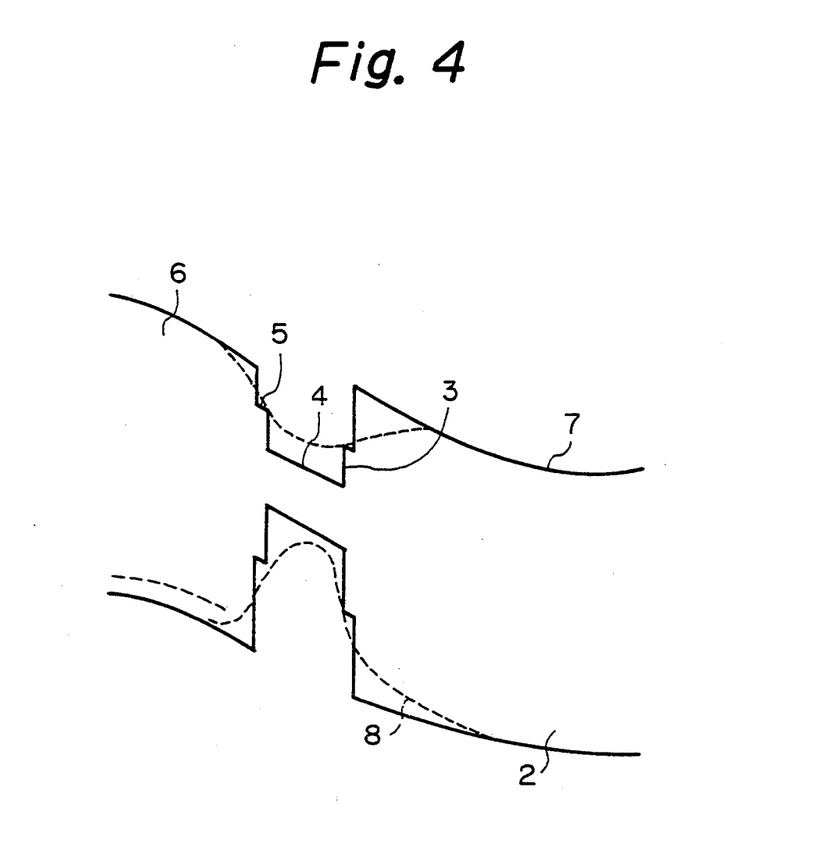
FIG. 4 is a diagram of an energy band gap of the structure according to the present invention shown in FIG. 3 in comparison with that of the conventional structure shown in FIG. 1.

FIG. 4 is a diagram showing the energy band gaps of the component layers of the structure of FIG. 3 according to the present invention, shown by solid lines 7, and the conventional structure of FIG. 1, shown by broken lines 8. The regions with reference numerals 2, 3, 4, 5 and 6 correspond to the layers denoted by these numerals, respectively.

It can be seen from FIG. 4 that present inventive structure (line 7) provides a sharp change in energy band gap at the interfaces between layers, i.e., the mutual diffusion between layers and the resulting degradation of electrical properties are completely suppressed in contrast to the conventional structure, in which the energy band gap (broken line 8) exhibits a gradual change between layers because of the occurrence of a mutual diffusion between the layers.

Figure 5A:
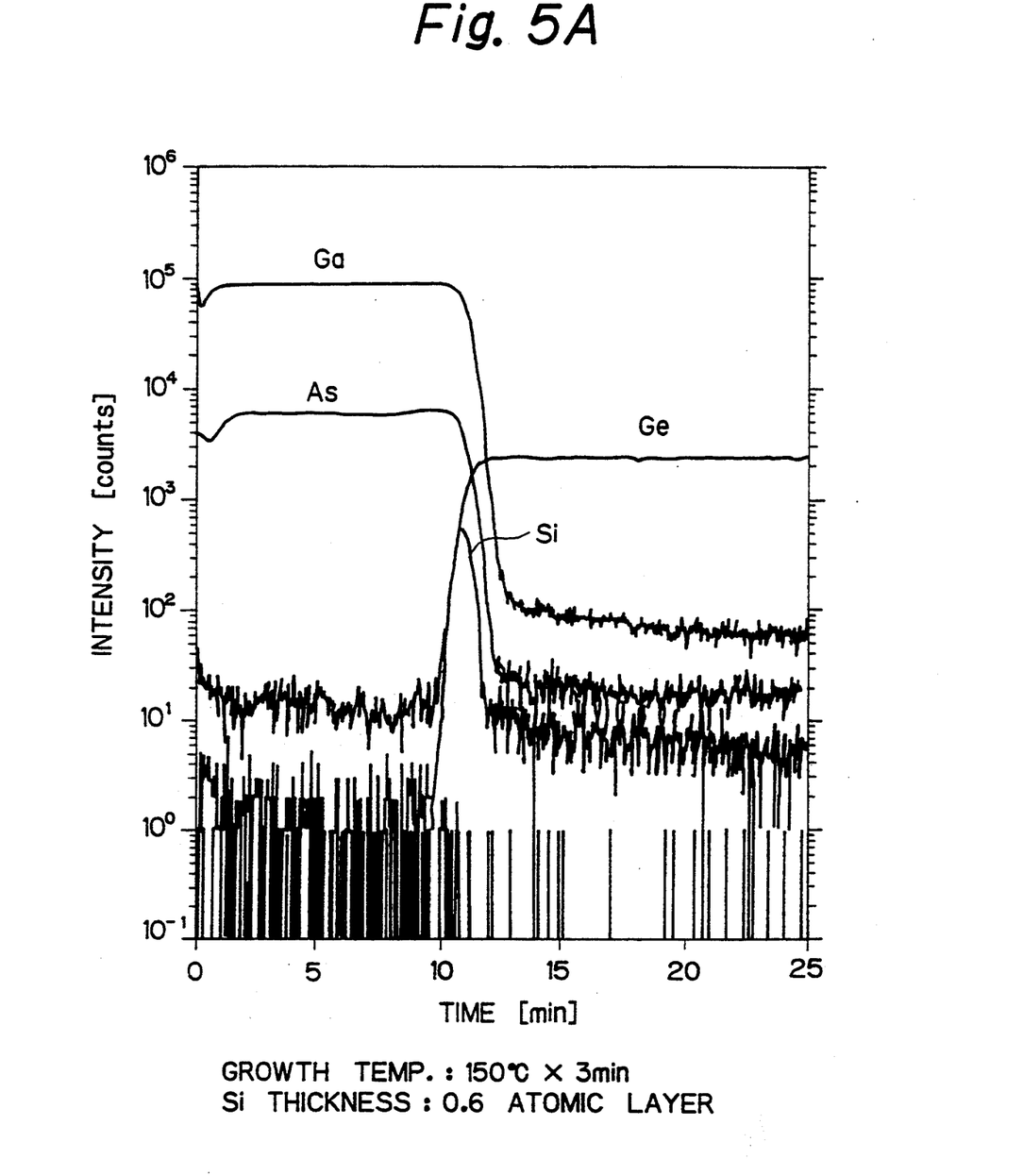
FIG. 5A, 5B and 5C are charts showing a SIMS analysis of the structure according to the present invention show in FIG. 3.
Figure 5B:
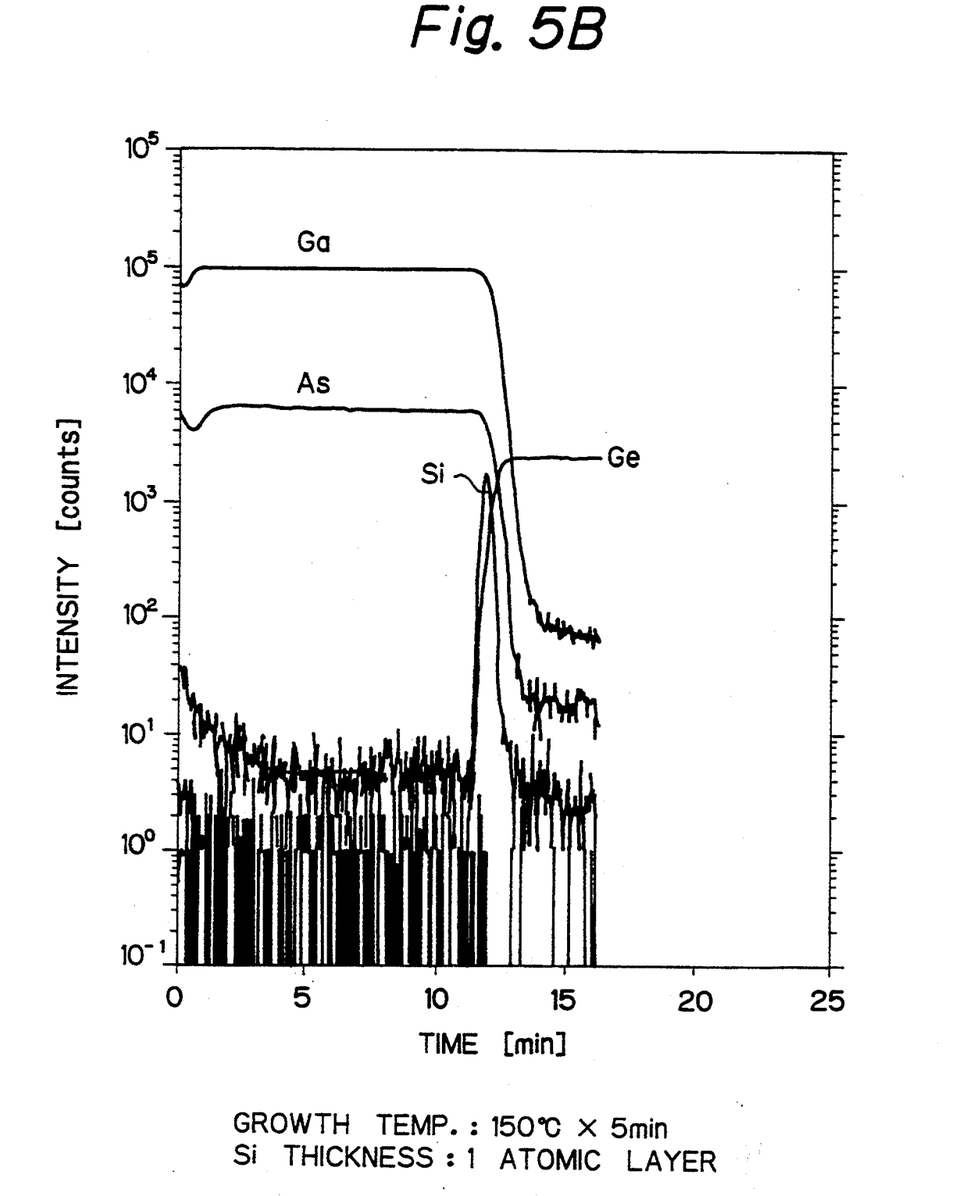
Figure 5C:
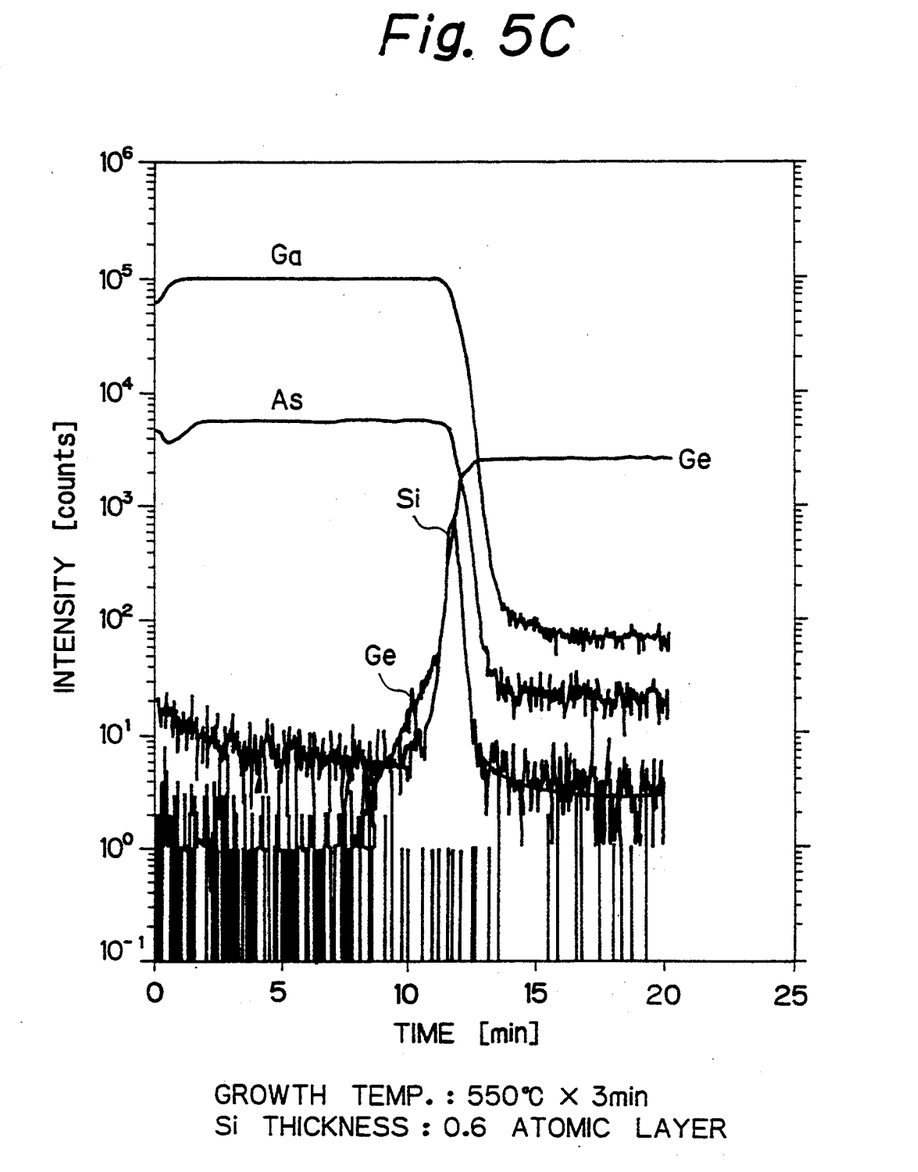
Figure 6A:
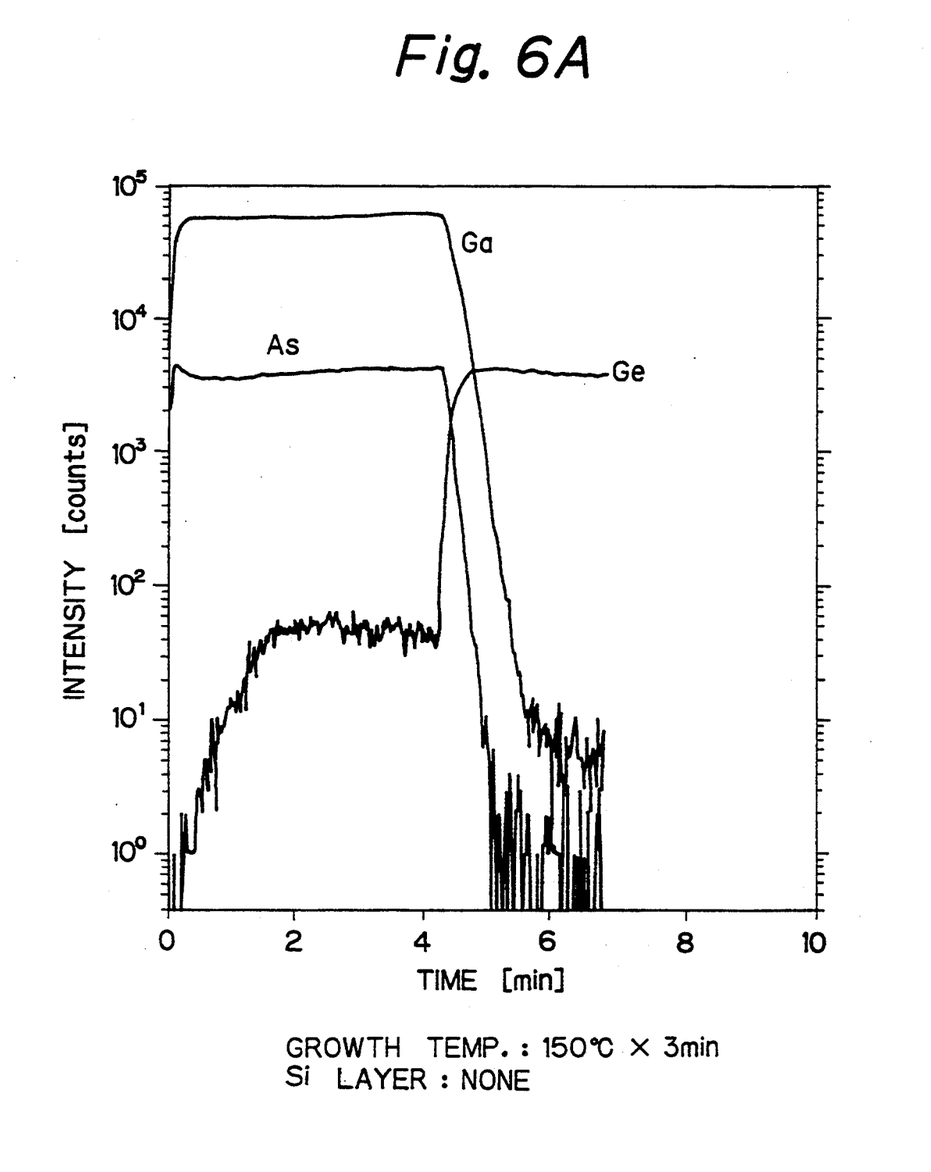
FIGS. 6A, 6B and 6C are charts showing a SIMS analysis of the conventional structure shown in FIG. 1.
Figure 6B:
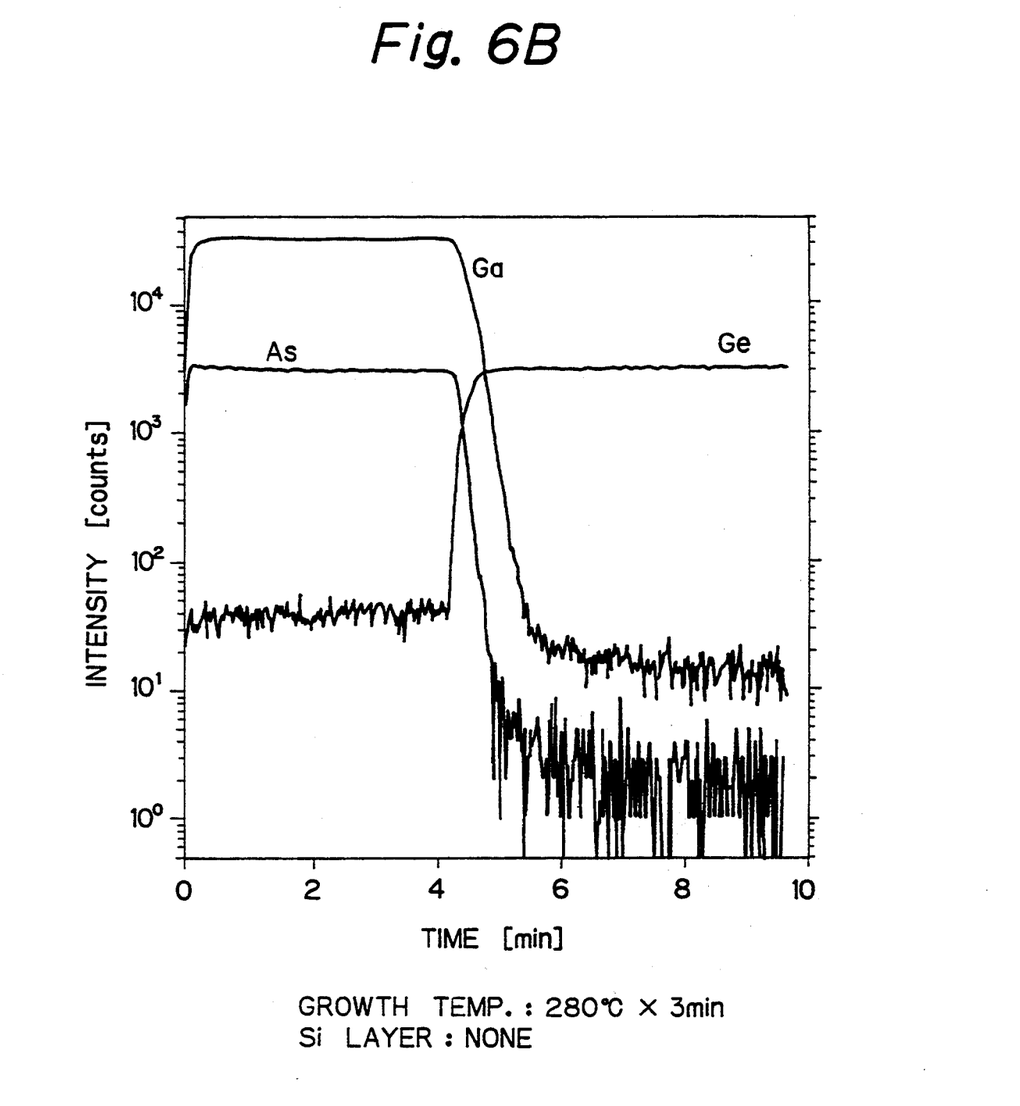
Figure 6C:
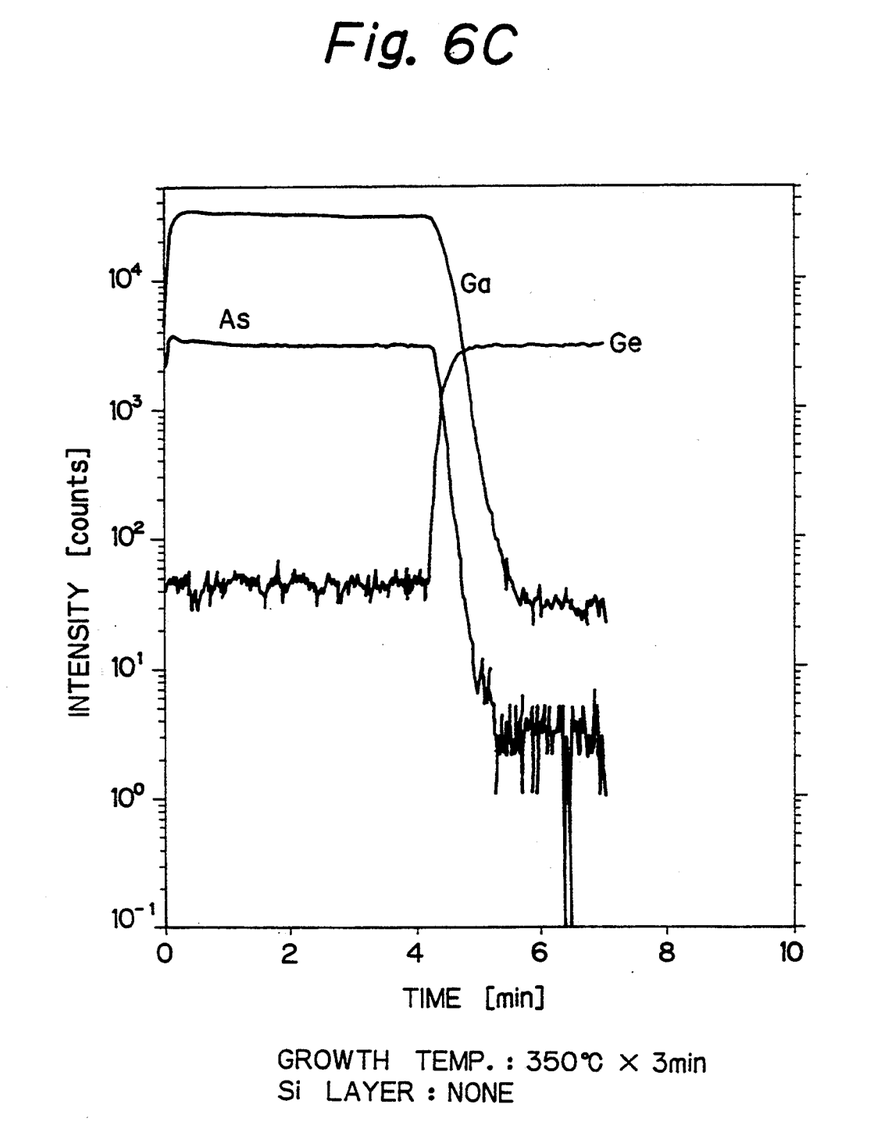

FIGS. 5A, 5B and 5C are charts showing a secondary ion mass spectrometer (SIMS) analysis of the semiconductor device structure provided with a mutual diffusion-preventing Si layer as shown in FIG. 3 according to the present invention and FIGS. 6A, 6B and 6C show that of the conventional structure not provided with the Si layer as shown in FIG. 1.

The results proved that no substantial mutual diffusion occurred between the GaAs and Ge semiconductor layers in the present inventive structure at crystal growth temperatures of 150° and 550° C. whereas, in the conventional structure, Ge extensively diffused into the GaAs layer even at the lowest crystal growth temperature of 150° C., and was uniformly distributed in the GaAs layer when the crystal growth was carried out at higher temperature of 280° or 350° C.

As hereinabove-described, the present invention provides a semiconductor device having a laminate structure of a group-III–V compound and group-IV element semiconductor layers and a process of producing same, in which component elements of the neighboring semiconductor layers are prevented from mutually diffusing from one to the other thereof.

I claim:

1. A semiconductor device which comprises:
a triple-layered structure consisting of a first single-crystalline layer of a group-III–V compound semiconductor, a second single-crystalline layer of a group-IV element semiconductor, and a third single-crystalline layer of an element semiconductor interposed between the first and second layers in a manner such that a coherent bond between crystal lattices is established at both interfaces between the first and third layers and between the third and second layers, wherein component elements of the first and second layers would undergo mutual diffusion from one to the other of the first and second layers if said first and second layers were in direct contact with each other, and wherein said third layer prevents said mutual diffusion.

2. A semiconductor device according to claim 1, wherein the first layer is composed of one compound semiconductor selected from the group consisting of GaAs, GaSb-, InAs-, and AlAs-semiconductor, and the third, mutual diffusion-preventing layer is composed of Si-semiconductor.

3. A semiconductor device according to claim 1, wherein the third layer interposed between the first and second layers has a thickness of from 0.5 to 2 atomic layers.

* * * * *